(12) United States Patent
Doan

(10) Patent No.: US 7,170,667 B1
(45) Date of Patent: Jan. 30, 2007

(54) LIFETIME IMPROVEMENT IN MICROSTRUCTURES WITH DEFORMABLE ELEMENTS

(75) Inventor: Jonathan Doan, Mountain View, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/303,088

(22) Filed: Dec. 14, 2005

(51) Int. Cl.
*G02B 26/00* (2006.01)
(52) U.S. Cl. .................. 359/290; 359/291; 359/224
(58) Field of Classification Search ............ 359/290, 359/291, 223, 224, 242
See application file for complete search history.

(56) References Cited

U.S. PATENT DOCUMENTS

2003/0116528 A1 * 6/2003 Bernstein et al. ............... 216/2
2004/0233505 A1 * 11/2004 Huibers et al. ............. 359/291

FOREIGN PATENT DOCUMENTS

JP 10300962 * 11/1998

* cited by examiner

*Primary Examiner*—Timothy Thompson
*Assistant Examiner*—Jerry Fang
(74) *Attorney, Agent, or Firm*—W. James Brady, III; Frederick J. Telecky, Jr.

(57) ABSTRACT

A microelectromechanical device with a plastically deformable element of is exposed to illumination light so as to elongate the lifetime of the device on the customer side.

53 Claims, 8 Drawing Sheets

LIFETIME IMPROVEMENT IN MICROSTRUCTURES WITH DEFORMABLE ELEMENTS

TECHNICAL FIELD OF THE INVENTION

The present invention is related generally to the art of microstructures, and, more particularly, to methods for improving the lifetime of microstructures with deformable elements.

BACKGROUND OF THE INVENTION

Microstructures such as microelectromechanical devices (hereafter MEMS devices) having deformable elements may suffer from device failure when the deformable elements deform plastically. Plastic deformation may be accumulated over operation time and result in residual plastic deformation at the natural resting state. The residual plastic deformation alters the operational states of the MEMS device—causing device failure. When such MEMS device is a member of an array of MEMS devices, the MEMS device may fail when one or more deformable elements of the MEMS devices in the array have residual plastic deformation more than a certain amount relative to the deformable elements of other MEMS devices in the array. Illumination of the deformable elements may accelerate such plastic deformation.

As a way of example, a micromirror device is a type of MEMS device. A typical micromirror device has a reflective mirror plate attached to a deformable hinge so as to move in response to an electrostatic field. In a digital operation, the mirror plate moves between an ON and OFF state corresponding to different rotation angles. In one example, the OFF state can be the natural resting state of the mirror plate; while the ON state can be a state where the mirror plate is moved a certain angle relative to the natural resting state. The deformable hinge deforms when the mirror plate is deflected; and residual plastic deformation may be developed when the deformable hinge is held at the deflected position over time. Such accumulated residual deformation, in turn, may alter an operation state, such as the natural resting state of the mirror plate, the OFF state, and/or the ON state, and may cause device failure when such alteration exceeds a certain amount. A micromirror device is often used as a member of an array of micromirror devices, such as a spatial light modulator. When one or more of the deformable hinges of the micromirror devices in the array have residual plastic deformation exceeding beyond a certain amount relative to the deformable hinges of other micromirror devices, the micromirror array device, i.e. the spatial light modulator fails.

Spatial light modulators are used in modulating light so as to transfer signals. Illumination of the deformable hinges in the spatial light modulator may accelerate the plastic deformation, which in turn, reduces the lifetime of the device.

Therefore, a method is desired for treating the deformable element of a MEMS device so as to improve the lifetime of the MEMS device.

SUMMARY OF THE INVENTION

In view of the foregoing, the present invention discloses a method for improving the lifetime of MEMS devices with deformable elements by illuminating the devices prior to delivery of the device to customers. Alternatively, the method can be performed after the devices are delivered to the customers.

The method can be performed by illuminating the device such that the device receives a illumination energy density, which is defined as the product of the power density of the illumination light and time, of 1 kJ/cm$^2$ or higher, such as 3 kJ/cm$^2$ or higher, 10 kJ/cm$^2$ or higher, 30 kJ/cm$^2$ or higher, 300 kJ/cm$^2$ or higher, or 500 kJ/cm$^2$ or higher. The illumination light can be at irradiances (power density) of 0.01 W/cm$^2$ or higher, 1 W/cm$^2$, 2 W/cm$^2$ or higher, 5 W/cm$^2$ or higher, 10 W/cm$^2$ or higher, 15 W/cm$^2$ or higher, 20 W/cm$^2$ or higher, or 40 W/cm$^2$ or higher. The spectrum of the light can comprise wavelengths from 300 nm to 550 nm, such as from 370 nm to 470 nm. An exemplary light source for generating the illumination light for illuminating the device can be a microwave powered lamp, such as a lamp with a V-bulb. Another exemplary light source usable in the invention is an arc lamp. It is worthwhile to point it out that the illumination light source may or may not be the same or the same type as the light source for providing illumination light during the operation of the device.

The device can be exposed to the illumination light in many ways. For example, the device can be arranged relative to the illumination light such that the deformable elements of the device are directly exposed to the illumination light. A particular example of such device is a micromirror device wherein the reflective mirror plates and deformable hinge are formed on a substrate that is transmissive to the illumination light, such as glass, quartz, and sapphire. For those micromirrors wherein the deformable hinges and reflective mirror plates are formed on substrates that are not transmissive to the illumination light, such as semiconductor substrates, the deformable hinges may not be directly exposed to the illumination light.

The MEMS device can alternatively be illuminated in an illumination chamber. Such a system is capable of providing efficient coupling of the output optical power from the lamp to the devices being treated, such as efficiencies (optical power in the desired spectral range delivered to the device(s)/power input to the bulb) of 0.5% or greater, 5% or greater or 20% or greater. An exemplary such chamber comprises a space formed of a reflective surface. The reflective surface may have an optical coating, such as an aluminum or silver layer with a dielectric layer so as to achieve reflectivity of 90% or higher or 99% or higher to the light from the light source used in the illumination treatment. The illumination light source for providing the illumination light, such as a microwave powered lamp can be disposed within or alternatively outside (though less preferred) the chamber.

Depending upon the irradiance provided by the system, and orientation of the MEMS device relative to the illumination light, the device can be exposed to the illumination light for a time 10 minutes or longer, such as 30 minutes or longer, or one hour or longer, and from 1 hour to 20 hours. In general, less energy may be sufficient for direct illumination of the deformable elements than for indirect illumination. Given the illumination direction and device, a shorter time may be sufficient for illumination-treatment systems providing higher irradiance to the device than those providing less irradiance. In exposing the MEMS device to the illumination-treatment light, the MEMS device may reach a temperature of 70° degrees or higher, or 100° degrees or higher, 150° degrees or higher, and 200° degrees or higher, but preferably less than the lowest of the maximum tolerance temperatures of the functional components of the MEMS devices. As a way of example, epoxy used in bonding the substrates of the micromirror device may have the lowest maximum tolerance temperature as compared to the maximum tolerance temperatures of other functional components in the micromirror device, the illumination treatment of the invention is the preferably carried out at a temperature less than the tolerance temperature of epoxy, but preferably equal to and higher than 70° degrees, more preferably 100° C. or higher, such as from 100° C. to 120° C.

The illumination treatment can be performed after the device is delivered to customers, for example, after being installed in end-systems (e.g. projection systems). The illumination treatment can also be performed prior to delivery to customers, but after packaging wherein the device is enclosed within a space between a package substrate and package lid for protection. Alternatively, the illumination treatment can be performed during packaging, such as after attaching the device onto the package substrate but before sealing the device with the package lid. In yet another example, the illumination treatment can be performed prior to packaging but after releasing the device by removing the sacrificial materials from the fabricated device. Specifically, the illumination treatment can be performed after the deformable element of the device is released and before or after assembly. For example, when the MEMS device is a micromirror device composed of a first and second substrate wherein one of the substrate have formed thereon an array of reflective and deflectable mirror plates; and the other one having formed thereon an array of addressing electrodes for deflecting the mirror plates. After fabrication of the mirror plates on one of the substrates, said substrate needs to be assembled to the other substrate wherein the electrode array is formed. In an example of the invention, the illumination treatment can be performed for the deformable elements of the micromirrors before such assembly. Alternatively, the illumination treatment can be performed after the assembly of the micromirrors to the addressing electrodes. In fact, the illumination treatment can also be performed at different time intervals and for multiple times. For example, the illumination treatment can be performed after releasing but prior to packaging. After packaging, however, the packaged device can still be illuminated with the method of the invention.

Often, the MEMS devices are fabricated on wafers. For example, a wafer may have a plurality of dies with each die having an array of deformable elements. Accordingly, the illumination treatment of the invention can be performed on the wafer level. In an example wherein the MEMS devices are micromirror devices, the illumination treatment of the invention can be performed on the wafer level. For one example wherein the micromirror array device comprises the first and second substrates with the mirror plates and deformable hinges formed on one of the two substrates and the addressing electrodes on the other, such micromirror devices can be formed on wafer level. Specifically, a mirror wafer may be formed thereon a plurality of mirror dies each of which comprises an array of deflectable and reflective mirror plates; and an electrode wafer has formed thereon a plurality of electrode dies each of which comprises an array of addressing electrodes. The two wafers with the functional elements formed thereon can be processed (fabricated) separately followed by assembly. The assembly can be done on the wafer level or on the die level. On the die level, the dies on the wafers are singulated and then assembled. On the wafer level, the wafers are assembled such that the individual dies on each wafer are assembled accordingly. Regardless of the different fabrication and assembly procedures for fabricating the micromirror array devices, the illumination treatment of the invention can be performed after release of the deformable hinges and reflective mirror plates but before or after assembly of the micromirrors to the addressing electrodes.

After the illumination treatment of the invention, the time for the device to develop a rest state twist change (e.g. 0.15, or 0.5 degree) can be 1.2 times or longer, 1.3 times or longer, 2 times or longer, 4 times or longer, 6 times or longer, 8 times or longer, or 10 times or longer than the time for the device to develop the same rest state twist change without the illumination treatment of the invention. In another word, the lifetime of the device can be increased.

The objects and advantages of the present invention will be obvious, and in part appear hereafter and are accomplished by the present invention. Such objects of the invention are achieved in the features of the independent claims

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 6b illustrates in a perspective view of the packaged micromirror array device shown in FIG. 6a;

FIG. 8 illustrates an exemplary display system having the micromirror array device show in FIG. 6a;

FIG. 9 illustrates another exemplary display system having multiple micromirror array devices shown in FIG. 6a;

FIG. 10 illustrates yet another exemplary display system having the micromirror array device shown in FIG. 6a;

DETAILED DESCRIPTION OF THE EMBODIMENTS

Disclosed herein is a method for improving the lifetime of MEMS devices with deformable elements by illuminating the devices with intense light before the devices are used in normal service. The invention is applicable to MEMS devices with deformable elements, especially the deformable elements that may accumulate residual plastic deformation over operation time. In view of many possible variations, the invention will be discussed in the following with reference to particular examples wherein the MEMS devices are micromirror devices each having a deformable hinge attached thereto a reflective and deflectable mirror plate. Depending upon different configurations, the deformable hinge can be a torsion hinge, flexure hinge, or other type of hinge. Even the micromirror devices in the following discussion may have a variety of different configurations. It will be understood by those skilled in the art that the following discussion is for demonstration purposes only, and should not be interpreted as a limitation. Other variations without departing from the spirit of the invention are also applicable.

Figure 1:
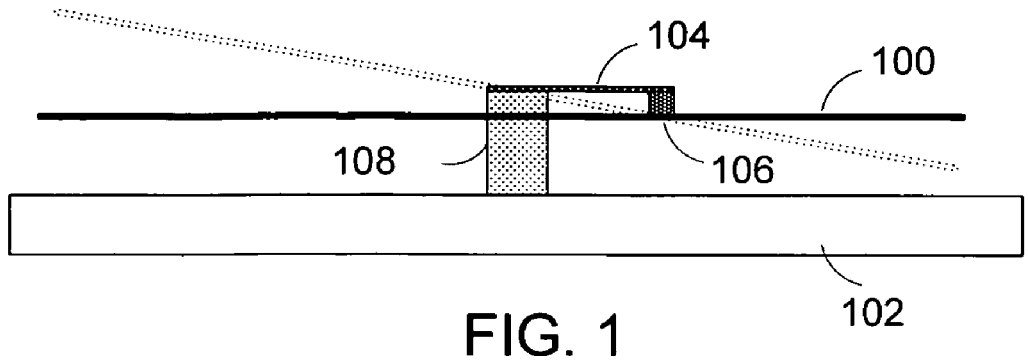
FIG. 1 is a cross-sectional view of an exemplary micromirror in which embodiments of the invention can be implemented.

Turning to the drawings, FIG. 1 demonstratively illustrates a cross-sectional view of an exemplary micromirror in which embodiments of the invention can be implemented. The micromirror comprises reflective mirror plate 100 attached to deformable hinge 104 via hinge contact 106. The deformable hinge is affixed to and held by post 108 on substrate 102. With this configuration, the mirror plate is capable of moving relative to the substrate. In digital operation, the mirror plate is capable of rotating between an ON state and OFF state.

Deflection of the mirror plate is accomplished through an addressing electrode (not shown in the figure for simplicity) disposed proximate to and associated with the mirror plate. In a typical operation, an electrostatic field is established between the mirror plate and addressing electrode. Such electrostatic field yields an electrostatic force that results in an electrostatic torque to the mirror plate. With this electrostatic torque, the mirror plate is switched between the natural resting state and ON state. In a particular example, an ON state stop can be provided for limiting the rotation of the mirror plate when the mirror plate arrives at the desired ON state. During the rotation of the mirror plate, the deformable hinge deforms. Such deformation is stored in the deformable hinge. When the OFF state (which can be the natural resting state) is desired, the electrostatic field is removed or reduced in its amplitude to the extend that the electrostatic torque resulted therefrom is not sufficient enough to balance the stored mechanical restoration force from the deformation stored in the deformable hinge; and the mirror plate is rotated to the OFF state (which can be the natural resting state) with the release of the stored deformation in the hinge. During the actuation of the mirror plate, especially during the time when the deformable hinge is held at the deflected state, the deformable hinge may accumulate plastic deformation, which may in turn, cause an offset of the natural resting state. Consequently, the mirror plate will not be able to resume its original natural resting state, but returns to an intermediate state between the original natural resting state and the ON state.

Figure 2:
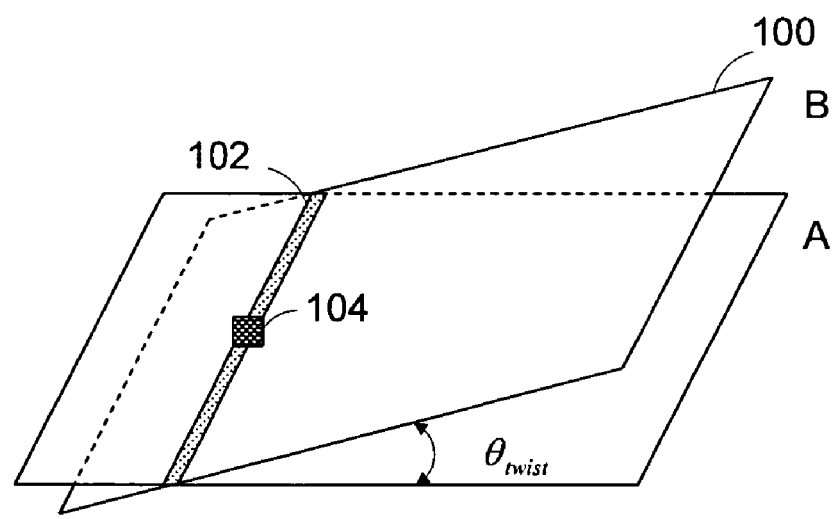
FIG. 2 is a perspective view of the a portion of the micromirror in FIG. 1 for defining the twist angle.

The plastic-deformation-induced operation-state offset is better illustrated in FIG. 2. Referring to FIG. 2, position A is the natural resting state of the mirror plate wherein no external driving forces are exerted to the mirror plate. After a period of operation, the natural resting state A may drift to position B due to accumulated residual plastic deformation in the deformable hinge. The twist change, rotation around the primary axis of the deformable hinge, can be quantitatively described with angle $\theta_{twist}$ between the mirror plate at the natural resting state A and drifted position B, as shown in the figure.

Figure 3:
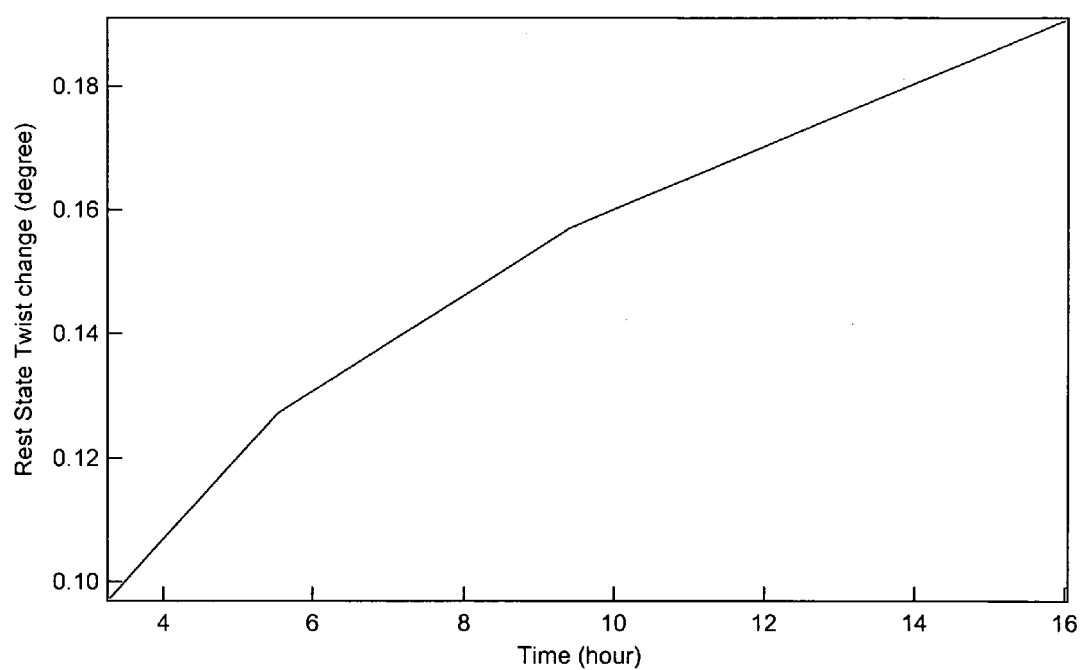
FIG. 3 plots the rest-state twist change versus operation time in an exemplary micromirror device.

The plastic deformation may be accumulated over the operation time, which in turn, increases the offset of the natural resting state. As a way of example, FIG. 3 plots the change of the rest-state twist in a typical micromirror device over operation time in the presence of light (e.g. light from a projection system as will be illustrated in FIGS. 8 to 11). It can be seen from the figure that the rest-state twist change monotonically increases over operation time. For the sample micromirror device being measured, the rest-state twist angle changes more than 0.15 degrees after approximately 9 hours of operation. If the production specification defines the limit of the twist angle change equal to or less than 0.15° degrees, the device will fail after a period of time associated with the 9 hours in the accelerated measurement.

In order to increase the lifetime of the micromirror device, the micromirror device is exposed to an illumination-treatment light before delivery to customers according to the invention, for example, after being installed in end-systems (e.g. projection systems). After the illumination treatment, development of residual plastic deformation in the deformable hinge during future operation on the customer side can be slowed down. Specifically, the rate of change of rest (or off) state twist can be reduced during operation; and/or the relative rate of change of rest (or off) state twist can be reduced during operation. The time for the device to develop a rest state twist change (e.g. 0.15, or 0.5 degree) can be 1.2 times or longer, 1.3 times or longer, 1.4 times or higher, 2 times or longer, 4 times or longer, 6 times or longer, 8 times or longer, or 10 times or longer than the time for the device to develop the same rest state twist change without the illumination treatment of the invention. Therefore, the lifetime of the individual micromirror devices, as well as the micromirror array device can be improved.

The illumination can be performed at the natural resting state. Alternatively, it can be performed at a deflected state. After the illumination treatment, the operational states, such as the ON and/or OFF state may be altered. For this reason, new operation states may be defined in view of the generated residual plastic deformation; and the micromirror device can be operated in the new defined operation states. However, definition of the new operation states may not be necessary, especially when the micromirror is operated as a member of an array of micromirror devices.

In an array of micromirror devices, the relative twist angle difference between mirror plates in an array may be of more importance than the twist angle of any given mirror plate. The performance of the micromirror array device may not exhibit noticeable degradation even though all micromirror devices in the array carry the same or similar amount of residual plastic deformation such that the twist angle differences between the individual micromirror devices of the array are smaller than the specification, such as 0.15° degrees or higher or 0.50 degrees or higher.

Figure 4:
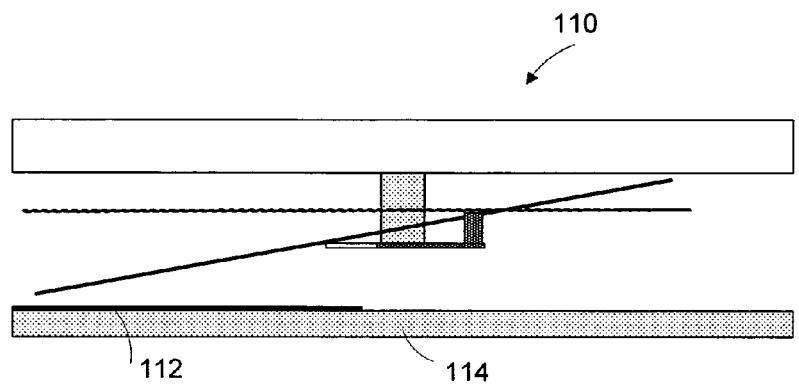
FIG. 4 illustrates an exemplary micromirror device in a cross-sectional view in which embodiments of the invention can be implemented.

The illumination treatment of the invention can be performed in many ways. In one example of the invention, the micromirror devices can be illuminated after being packaged, as will be discussed in the following with reference to FIG. 4 to FIG. 6b. Referring to FIG. 4, the micromirror as shown in FIG. 1 after assembly with an addressing electrode is demonstratively illustrated therein. Specifically, the reflective mirror plate formed on the light transmissive substrate is assembled with addressing electrode 112 on semiconductor substrate 114. The two substrates can be bonded together hermetically or non-hermetically. The micromirror device as shown in FIG. 4 is often used as a member of an array of micromirror devices, an example of which is shown in FIG. 5.

Figure 5:
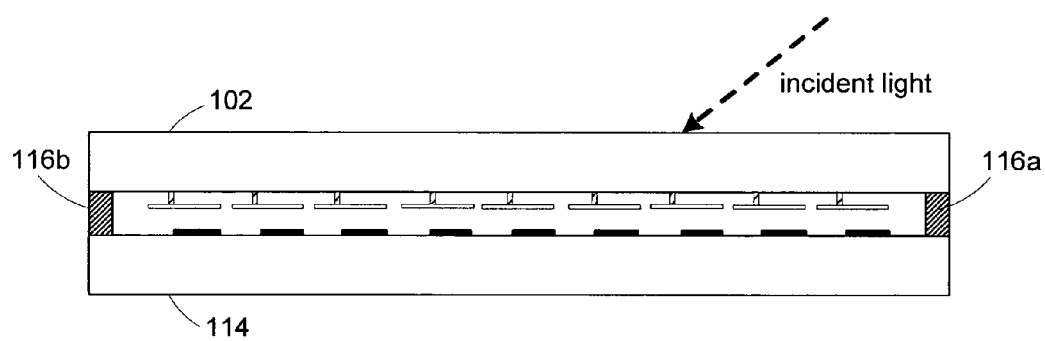
FIG. 5 is a cross-sectional view of an exemplary micromirror array device having an array of micromirror devices shown in FIG. 4.

Referring to FIG. 5, the micromirror array device comprises light transmissive substrate 102, on which an array of reflective and deflectable mirror plates is formed. Light transmissive substrate 102 is bonded to semiconductor substrate 114 with spacers 116a and 116b. The spacers can be a sealing ring disposed around the perimeter of the substrates. The semiconductor substrate 114 has an array of addressing electrodes disposed proximate to and associated with the mirror plates such that each mirror plate of the array can be electrostatically deflected by one or more addressing electrodes. In spatial light modulation, the incident light travels through the light transmissive substrate and impinges on the reflective surfaces of the mirror plates. The states of the individual mirror plates are in accordance with image data derived from the desired images or other signals to be transformed.

Figure 6A:
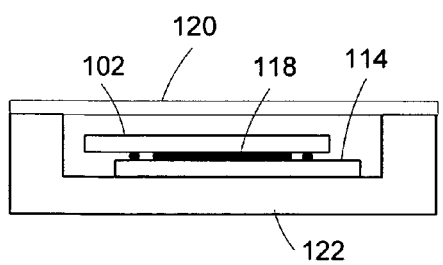
FIG. 6a illustrates in a cross-sectional view of a package in which the micromirror array device as shown in FIG. 4 is enclosed.
Figure 6B:
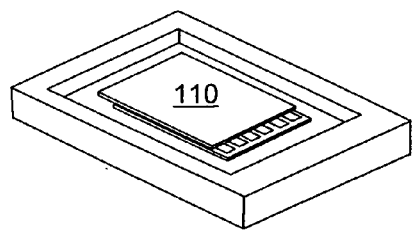

The spatial light modulator as shown in FIG. 5 is often enclosed within a package for protection. An exemplary package is illustrated in FIG. 6a. Referring to FIG. 6a, the micromirror device as shown in FIG. 5 is attached to a supporting surface of the cavity of package substrate 122 that can be ceramic. Light transmissive package lid 120 is bonded to the package substrate so as to seal the micromirror device within a space between the package lid and package substrate, as set forth in U.S. patent application Ser. No. 10/167,361 filed Jun. 11, 2002, Ser. No. 10/443,318 filed Apr. 22, 2003, Ser. No. 10/852,981 filed Apr. 24, 2004, the subject matter of each being incorporated herein by reference. A perspective view of the device package in FIG. 6a is demonstratively illustrated in FIG. 6b. As can be seen in FIG. 6b, micromirror device 110 is enclosed within the package.

In an example of the invention, the illumination treatment can be performed prior to delivery to customers, but after packaging wherein the device is enclosed within a space between a package substrate and package lid for protection. Alternatively, the illumination treatment can be performed during packaging, such as after attaching the device onto the package substrate but before sealing the device with the package lid. In yet another example, the illumination treatment can be performed prior to packaging but after releasing the device by removing the sacrificial materials from the fabricated micromirror device. Specifically, the illumination treatment can be performed after the deformable hinge and reflective mirror plate of the device are released and before or after assembly. For example, when the micromirror device comprises a first and second substrate wherein one of the substrates has formed thereon an array of reflective and deflectable mirror plates; and the other has formed thereon an array of addressing electrodes for deflecting the mirror plates. After fabrication of the mirror plates on one of the substrates, said substrate needs to be assembled to the other substrate wherein the electrode array is formed. In an example of the invention, the illumination treatment can be performed for the deformable elements of the micromirrors before such assembly. Alternatively, the illumination treatment can be performed after the assembly of the micromirrors to the addressing electrodes. In fact, the illumination treatment can also be performed at different time intervals and for multiple times. For example, the illumination treatment can be performed after releasing but prior to packaging. After packaging, however, the packaged device can be illuminated with the method of the invention.

Often times, the micromirror devices are fabricated on wafers. For example, a wafer may have a plurality of dies with each die having an array of deformable hinges and reflective mirror plates. Accordingly, the illumination treatment of the invention can be performed on the wafer level. For one example wherein the micromirror array device comprises a first and second substrate with mirror plates and deformable hinges formed on one of the two substrates and the addressing electrodes on the other, such micromirror devices can be formed on wafer level. Specifically, a mirror wafer may have formed thereon a plurality of mirror dies each of which comprises an array of deflectable and reflective mirror plates; and an electrode wafer has formed thereon a plurality of electrode dies each of which comprises an array of addressing electrodes. The two wafers with the functional elements formed thereon can be processed (fabricated) separately followed by assembly. The assembly can be done on the wafer level or on the die level. On the die level, the dies on the wafers are singulated and then assembled. On the wafer level, the wafers are assembled such that the individual dies on each wafer are assembled accordingly. Regardless of the different fabrication and assembly procedures for fabricating the micromirror array devices, the illumination treatment of the invention can be performed after release of the deformable hinges and reflective mirror plates but before or after assembly of the micromirrors to the addressing electrodes.

In a typical illumination treatment, the micromirror device (or a micromirror array device comprising an array of micromirror devices) is set to the natural resting state wherein the reflective mirror plate and the deformable hinge with the mirror plate attached thereto are at the natural resting position. Alternatively, the micromirror device (or the micromirror array device) can be held at other states, such as the operational ON and OFF (non-natural resting state) state or other non-operational states other than the natural resting state. Specifically, the micromirror device can be set to a deflected state wherein the mirror plate has a non-zero negative angle relative to the substrate on which the mirror plate and the deformable hinge is formed. For example, the ON state angle corresponds to the ON state can be +8° degrees or more, +10° degrees or more, +12° degrees or more, +14° degrees or more, and +16° degrees or more relative to the substrate on which the mirror plate is formed. The OFF state can be the natural resting state that may or may not be parallel to the substrate on which the mirror plate and deformable hinge are formed. For example, the OFF state (or the natural resting state) can be a state wherein the mirror plate is −2° degrees or less, −4° degrees or less, −6° degrees or less relative to the substrate on which the mirror plate and deformable hinge are formed.

The illumination treatment can be performed by illuminating the device such that the device receives an illumination energy density, which is defined as the product of the power density of the illumination-treatment light and time, of 1 kJ/cm$^2$ or higher, such as 3 kJ/cm$^2$ or higher, 10 kJ/cm$^2$ or higher, 30 kJ/cm$^2$ or higher, 300 kJ/cm$^2$ or higher, or 500 kJ/cm$^2$ or higher. The illumination-treatment system can provide irradiances (power density) of 0.01 W/cm$^2$ or higher, 1 W/cm$^2$, 2 W/cm$^2$ or higher, 5 W/cm$^2$ or higher, 10 W/cm$^2$ or higher, 15 W/cm$^2$ or higher, 20 W/cm$^2$ or higher, or 40 W/cm$^2$ or higher. The spectrum of the illumination-treatment light can comprise wavelengths from 300 nm to 550 nm, such as from 370 nm to 470 nm. An exemplary light source for generating the light for the illumination treatment can be a microwave powered lamp, such as a Fusion lamp™ with a V-bulb. Another exemplary light source usable in the invention is an arc lamp. It is worthwhile to point it out that the illumination-treatment light source may or may not be the same or the same type as the display-system light source for providing light during the operation of the device. It is preferred that the irradiance in the desired spectral range supplied to the device by the illumination-treatment light source be as large or larger than that supplied to the device by the display-system light source.

The micromirror array device can be exposed to the illumination-treatment light in many ways. For example, the device can be arranged relative to the illumination-treatment light such that the deformable elements of the device are directly exposed to the illumination-treatment light. A particular example of such device is a micromirror device wherein the reflective mirror plates and deformable hinge are formed on a substrate that is transmissive to light, such as glass, quartz, and sapphire. For those micromirrors wherein the deformable hinges and reflective mirror plates are formed on substrates that are not transmissive to light, such as semiconductor substrates, the deformable hinges may not be directly exposed to the illumination-treatment light.

Depending upon the irradiance of the illumination-treatment system, and the orientation of the device relative to the light source, the device can be exposed to the illumination-treatment light for a time of 10 minutes or longer, such as 30 minutes or longer, or one hour or longer, and from 1 hour to 20 hours. In general, less energy may be necessary for direct illumination of the deformable element than indirect illumination during the illumination treatment. Given the illumination direction and device, a shorter time may be sufficient for illumination-treatment systems providing a higher irradiance than those providing less irradiance. In exposing the MEMS device to the illumination-treatment light, the MEMS device is preferably maintained at a temperature of 70° degrees or higher, or 100° degrees or higher, 150° degrees or higher, and 200° degrees or higher, but preferably less than the lowest of the maximum tolerance temperatures of the functional components of the MEMS devices. For example, the epoxy used in bonding the substrates of the micromirror device may have the lowest maximum tolerance temperature as compared to the maximum tolerance temperatures of other functional components in the micromirror device, the illumination treatment of the invention is the preferably carried out at a temperature less than the maximum tolerance temperature of epoxy, but preferably equal to and higher than 70° degrees, more preferably 100° C. or higher, such as from 100° C. to 120° C.

Figure 7:
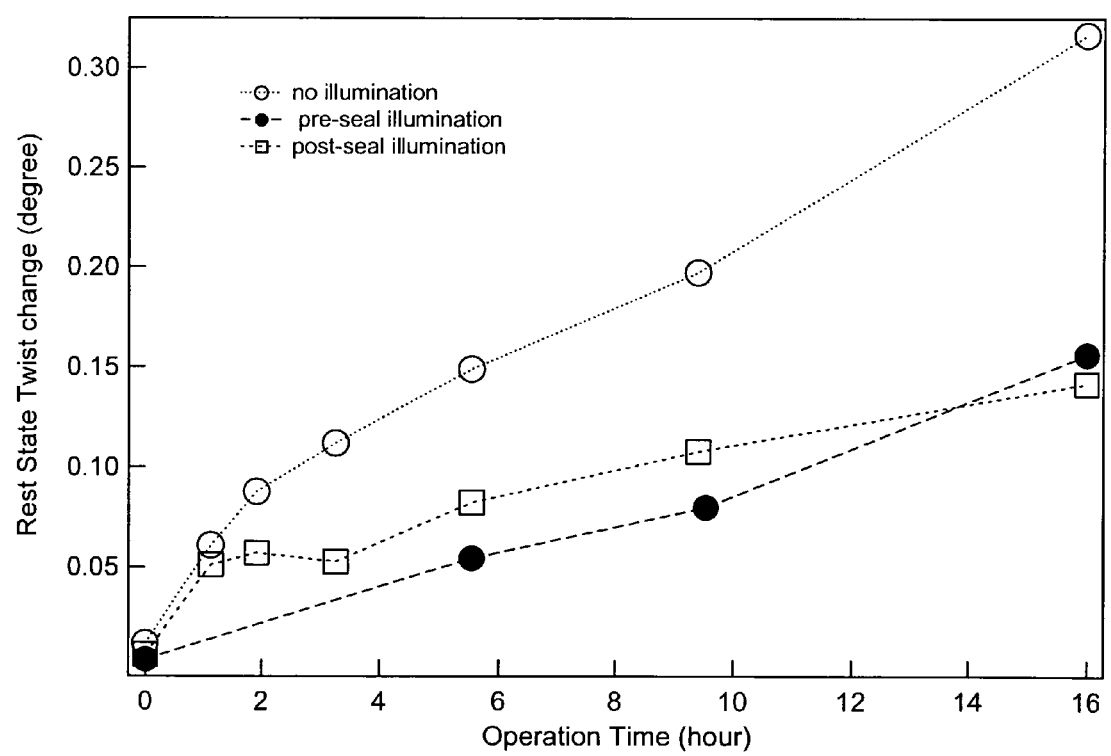
FIG. 7 plots the rest-state twist change versus operation time in an exemplary micromirror device after an illumination treatment according to the invention.

An exemplary effect of the illumination treatment is demonstratively illustrated in FIG. 7. Referring to FIG. 7, three micromirror array devices of the identical design and fabrication are measured such that measurement data from the three specimens are comparable. Of the three micromirror array devices, one is without the illumination treatment of the invention. Another one is processed with the illumination treatment before sealing the micromirror array device in the package—i.e. after attaching the micromirror array device to the package substrate but before bonding the package lid to the package substrate (as seen in FIG. 6a). The last one is a micromirror array device processed with the illumination treatment after being packaged.

In the figure, open circles plot the rest-state twist change over operation time for the micromirror array device without the illumination treatment of the invention. Solid circles plot the rest-state twist change over operation time for the micromirror array device illuminated before sealing. Open squares plot the rest-state twist change over operation time for the micromirror array device illuminated after being packaged. It can be seen in the figure that the lifetime for a given twist change in the product specification is significantly increased after the illumination treatment. For example, the lifetime of the micromirror array devices with the illumination treatments (regardless whether the treatments were done during or after packaging) to the twist change of 0.15° degrees is increased threefold or more as compared to the micromirror device without the illumination treatment of the invention.

The illumination treatment of the invention is also applicable to other types of micromirror devices that that discussed with reference to FIG. 1. For example, in the above example shown in FIG. 4, the mirror plate is associated with one addressing electrode (112) for deflecting the mirror plate according to the image data. In another example, each mirror plate can be associated with multiple addressing electrodes. In addition to the addressing electrodes, another electrode, such as a light transmissive electrode, can be provided for deflecting the mirror plate in the direction opposite to that resulted from the addressing electrode, such as being disposed on the lower surface of the light transmissive substrate, as set forth in U.S. patent application Ser. No. 11/102,531 filed Apr. 8, 2005, the subject matter being incorporated herein by reference in its entirety. An example of such electrode can be a thin film of indium-tin-oxide. The light transmissive electrode can also be a multi-layered structure. For example, it may comprise an electrically conductive layer and electrically non-conductive layer with the electrically conductive layer being sandwiched between the light transmissive substrate and the electrically non-conductive layer. This configuration prevents potential electrical shorts between the mirror plates and the electrode. The electrically non-conductive layer can be $SiO_x$, $TiO_x$, $SiNx$, and $NbO_x$, as set forth in U.S. patent application Ser. No. 11/102,531 filed Apr. 8, 2005, the subject matter being incorporated herein by reference. In other embodiments of the invention, multiple addressing electrodes can be provided for the micromirror device, as set forth in U.S. patent application Ser. No. 10/437,776 filed May 13, 2003, and Ser. No. 10/947,005 filed Sep. 21, 2004, the subject matter of each being incorporated herein by reference in entirety. Other optical films, such as a light transmissive and electrically insulating layer can be utilized in combination with the light transmissive electrode on the lower surface of the light transmissive substrate for preventing possible electrical short between the mirror plate and light transmissive electrode.

Alternative to forming the mirror plates on a separate substrate than the semiconductor substrate on which the addressing electrodes are formed, as shown in FIG. 1 and FIG. 4, the mirror plates and addressing electrodes can be formed on the same substrate, which is preferably a semiconductor substrate, which is not shown in the figure.

In another embodiment, the mirror plates can be derived from a single crystal, such as single crystal silicon, as set forth in U.S. patent application Ser. No. 11/056,732, Ser. No. 11/056,727, and Ser. No. 11/056,752 all filed Feb. 11, 2005, the subject matter of each being incorporated herein by reference in entirety.

The micromirror device as show in FIG. 1 and FIG. 4 is only one example of many applicable examples of the invention. For example, the mirror plate can be attached to the deformable hinge such that the mirror plate rotates asymmetrically. That is the maximum rotation angle (e.g. the ON state angle) achievable by the mirror plate rotating in one direction (the direction towards the ON state) is larger than that (e.g. the OFF stat angle) in the opposite rotation direction (e.g. the direction towards the OFF state). This is accomplished by attaching the mirror plate to the deformable hinge at a location that is not at the center of the mirror plate such that the rotation axis of the mirror plate is offset from a diagonal of the mirror plate. However, the rotation axis may or may not be parallel to the diagonal. Of course, the mirror plate can be attached to the deformable hinge such that the mirror plate rotates symmetrically—that is the maximum angle achievable by rotating the mirror plate in one direction is substantially the same as that in the opposite rotation direction.

The mirror plate of the micromirror can alternatively be attached to the deformable hinge such that the mirror plate and deformable hinge are in the same plane. In an alternative embodiment of the invention, the deformable hinge can be located in a separate plane from the mirror plate when viewed from the top of the mirror plate at a non-deflected state, which will not be discussed in detail herein.

The spatial light modulators of the display systems in FIG. 5 comprise an array of micromirror devices each of which has a reflective and deflectable mirror plate. The diagonal of the micromirror array can be from 0.55 inch to 0.8 inch, more preferably from 0.65 to 0.85 inch, and substantially around 0.7 inch. The total number of mirror devices in the spatial light modulator, which is referred to as the natural resolution of the spatial light modulator, is preferably 640×480 (VGA) or higher, such as 800×600 (SVGA) or higher, 1024×768 (XGA) or higher, 1280×1024 (SXGA) or higher, 1280×720 or higher, 1400×1050 or higher, 1600×1200 (UXGA) or higher, and 1920×1080 or higher. The micromirror devices each have a characteristic dimension in the order of microns, such as 100 micros or less, 50 microns or less, and 15 microns or less. The micromirror devices are arranged in arrays preferably with a pitch of 14.8 microns or less, 10.16 microns or less, or from 4.38 to 10.16 microns. The gap between the adjacent micromirror devices is preferably 1.5 microns or less, such as 1 micron or less, 0.5 micron or less, more preferably from 0.1 to 0.5 micron, as set forth in U.S. patent application Ser. No. 10/627,302 filed Jul. 24, 2003, the subject matter being incorporated herein by reference in entirety.

Figure 8:
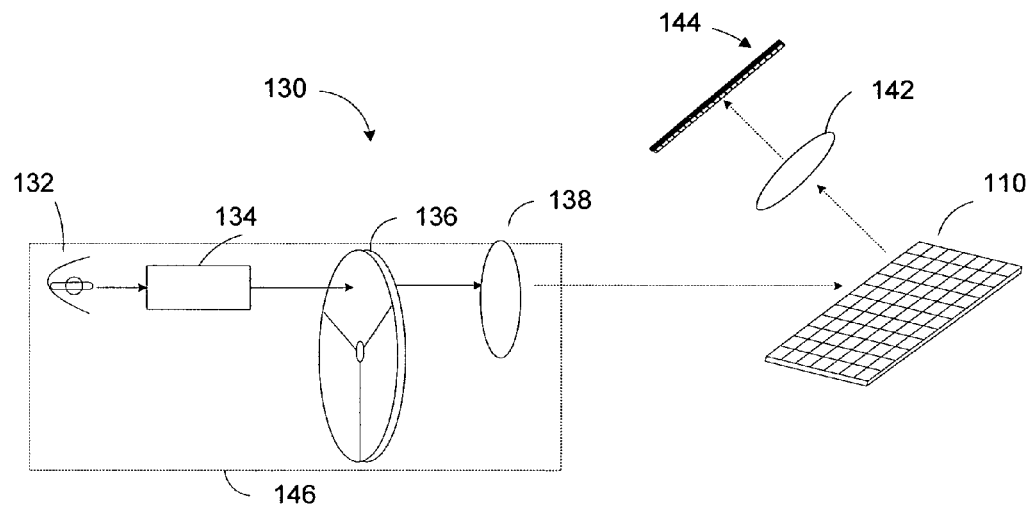

The micromirror device and the micromirror array device with the illumination treatment have many applications, one of which is display applications. FIG. 8 demonstratively illustrates an exemplary display system having a spatial light modulator. The spatial light modulator comprises a micromirror array device after the illumination treatment of the invention. In this particular example, display system 130 comprises light source illumination system 146, group lens 138, spatial light modulator 110, projection lens 142, and display target 144. It is worth noting that the display illumination system may or may not be the same system used for the illumination treatment. The display illumination system may further comprise light source 132, light pipe 134, and color filter 136 such as a color wheel. Alternative to the display illumination system 146 as shown in the figure wherein the color wheel is positioned after the light pipe along the propagation path of the light from the display light source, the color wheel can also be positioned between the display light source and light pipe at the propagation path of the display light. The display light can be polarized or non-polarized. When polarized illumination light is used, display target 144 may comprise a polarization filter associated with the polarized illumination light, as set forth in U.S. provisional patent application Ser. No. 60/577,422 filed Jun. 4, 2004, the subject matter being incorporated herein by reference.

The display light source can be any suitable light source, such as an arc lamp, preferably an arc lamp with a short arc for obtaining intense illumination light. The display light source can also be an arc lamp with a spiral reflector, as set forth in U.S. patent application Ser. No. 11/055,654 filed Feb. 9, 2005, the subject matter being incorporated herein by reference. Alternatively, the display light source can be light-emitting-diodes (LEDs), which will be detailed afterwards with reference to FIG. 10 and FIG. 11.

The lightpipe (134) can be a standard lightpipe that are widely used in digital display systems for delivering homogenized light from the display light source to spatial light modulators. Alternatively, the lightpipe can be one with movable reflective surfaces, as set forth in U.S. patent provisional application Ser. No. 60/620,395 filed Oct. 19, 2004, the subject matter being incorporated herein by reference.

The color wheel (136) comprises a set of color and/or white segments, such as red, green, blue, or yellow, cyan, and magenta. The color wheel may further comprise a clear or non-clear segment, such as a high throughput or white segment for achieving particular purposes, as set forth in U.S. patent application Ser. No. 10/899,637, and Ser. No. 10/899,635 both filed Jul. 26, 2004, the subject matter of each being incorporated herein by reference, which will not be discussed in detail herein.

Figure 9:
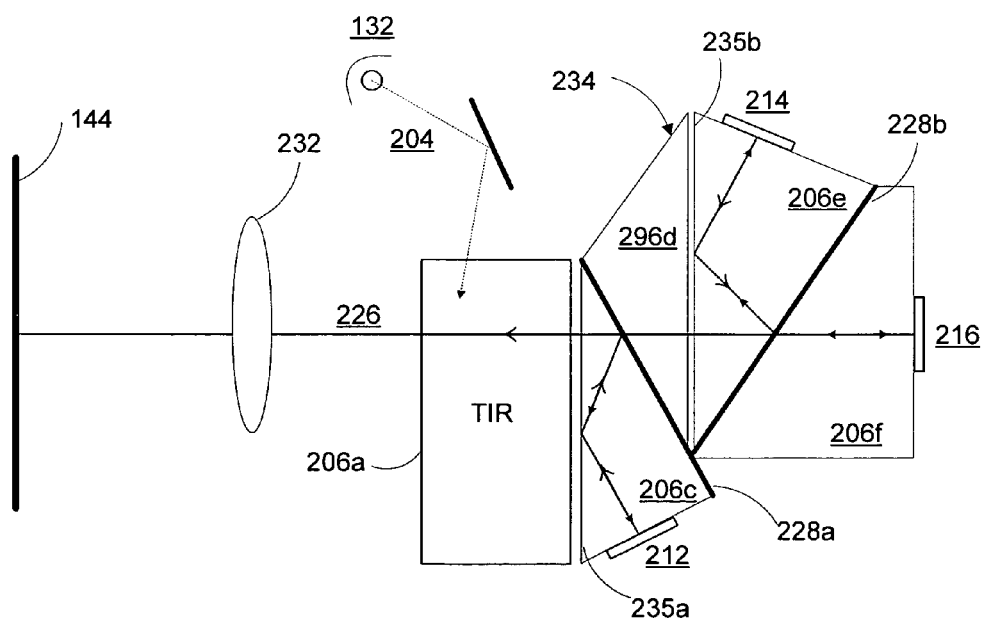

It is noted that the color wheel and lightpipe may not be necessary, especially when a LED is employed as the light source. The display system in FIG. 8 employs one spatial light modulator. However, a display system may use multiple spatial light modulators for modulating the display illumination light of different colors. One of such display systems is schematically illustrated in FIG. 9. Referring to FIG. 9, the display system uses a dichroic prism assembly 234 for splitting incident light into three primary color light beams. Dichroic prism assembly comprises TIR 206a, 206c, 206d, 206e and 206f. Totally-internally-reflection (TIR) surfaces, i.e. TIR surfaces 235a and 235b, are defined at the prism surfaces that face air gaps. The surfaces 228a and 228b of prisms 306c and 306e are coated with dichroic films, yielding dichroic surfaces. In particular, dichroic surface 228a reflects green light and transmits other light. Dichroic surface 228b reflects red light and transmits other light. The three spatial light modulators, 212, 214 and 216, each having a micromirror array device, are arranged around the prism assembly.

In operation, incident white light 204 from display light source 132 enters into TIR 206a and is directed towards spatial light modulator 216, which is designated for modulating the blue light component of the incident white light. At the dichroic surface 228a, the green light component of the totally internally reflected light from TIR surface 235a is separated therefrom and reflected towards spatial light modulator 212, which is designated for modulating green light. As seen, the separated green light may experience TIR by TIR surface 235b in order to illuminate spatial light modulator 212 at a desired angle. This can be accomplished by arranging the incident angle of the separated green light onto TIR surface 235b larger than the critical TIR angle of TIR surface 235b. The rest of the light components, other than the green light, of the reflected light from the TIR surface 235a pass through dichroic surface 228a and are reflected at dichroic surface 228b. Because dichroic surface 228b is designated for reflecting red light component, the red light component of the incident light onto dichroic surface 228b is thus separated and reflected onto spatial light modulator 204, which is designated for modulating red light. Finally, the blue component of the white incident light (white light 204) reaches spatial light modulator 186 and is modulated thereby. By collaborating operations of the three spatial light modulators, red, green, and blue lights can be properly modulated. The modulated red, green, and blue lights are recollected and delivered onto display target 144 through optic elements, such as projection lens 232, if necessary.

As mentioned earlier, an LED can be used in the display system as the light source for providing illumination light beams due to many advantages, such as compact size, longer lifetime than arc lamps, lower heating than arc lamps, and narrower bandwidth than arc lamps. As an example, gallium nitride light emitting diodes can be used for the green and blue arrays, and gallium arsenide (aluminum gallium arsenide) could be used for the red light emitting diode array. LEDs such as available or disclosed by Nichia™ or Lumileds™ could be used, or any other suitable light emitting diodes. Some of the current LEDs have a lifetime of 100,000 hours or more, which is almost 10 times higher than the lifetime of the current ultra-high-pressure (UHP) arc lamp with the longest lifetime. LEDs are cold light source, which yields much less heat than arc lamps. Even using multiple LEDs in a display system, the total heat generated by the LEDs can be dissipated much easier than using the arc lamps, because the heat generated by the LEDs is omni-directional as compared to the heat generated by the arc lamps wherein the heat has preferred orientations. Currently, LEDs of different colors have been developed. When multiple LEDs of different colors, such as red, green, and blue, are concurrently employed in the display system, beam splitting elements, such as color wheel, that are required for the arc lamp, can be omitted. Without light splitting elements, system design and manufacturing can be significantly simplified. Moreover, the display system can be made more compact and portable.

As compared to current arc lamps, LEDs are also superior in spectrum to arc lamps. The spectrum of a LED has a typical width of 10 nm to 35 nm. However, the typical spectrum width of the colors (e.g. red, green, and blue) derived from the color wheel used in combination with an arc lamp is approximately 70 nm, which is much larger than that of the LED. In other words, LEDs have much purer colors than arc lamps, resulting in more abundant colors than arc lamps.

Like arc lamps, LEDs may have the color balance problem, wherein different colors may have different intensities. This problem for LEDs, however, can be solved simply by time-mixing or spatial-mixing mode. In spatial-mixing mode, different number of LEDs for different colors can be provided for balancing the intensity discrepancies in different colors. In time-mixing mode, the color can be balanced by tuning the ON-time ratio of different LEDs for different colors, which will be detailed with reference to FIG. 11.

To be commensurate with the display system, the LEDs used in the projection system preferably have a light flux of 3 lumens or higher, such as 4.4 lumens or higher, and 11.5 lumens or higher.

Using multiple LEDs of different colors has other practical benefits as compared to using the arc lamp and color wheel. In the display system using the arc lamp and color wheel, color transitions unavoidably occur as the color wheel spins and color fields in the color wheel sequentially sweep across the micromirror array of the spatial light modulator. The color transition may cause extra design for the system, which complicate the system. Moreover, color transition reduces optical efficiency of the system, for example, a portion of the incident light has to be sacrificed. As a comparison, LEDs may not have the color transition problem. Regardless whether the LEDs sequentially or concurrently illuminating the micromirror devices of the spatial light modulator, all micromirror devices of the spatial light modulator can be illuminated by a light beam of specific color at a time.

Figure 10:
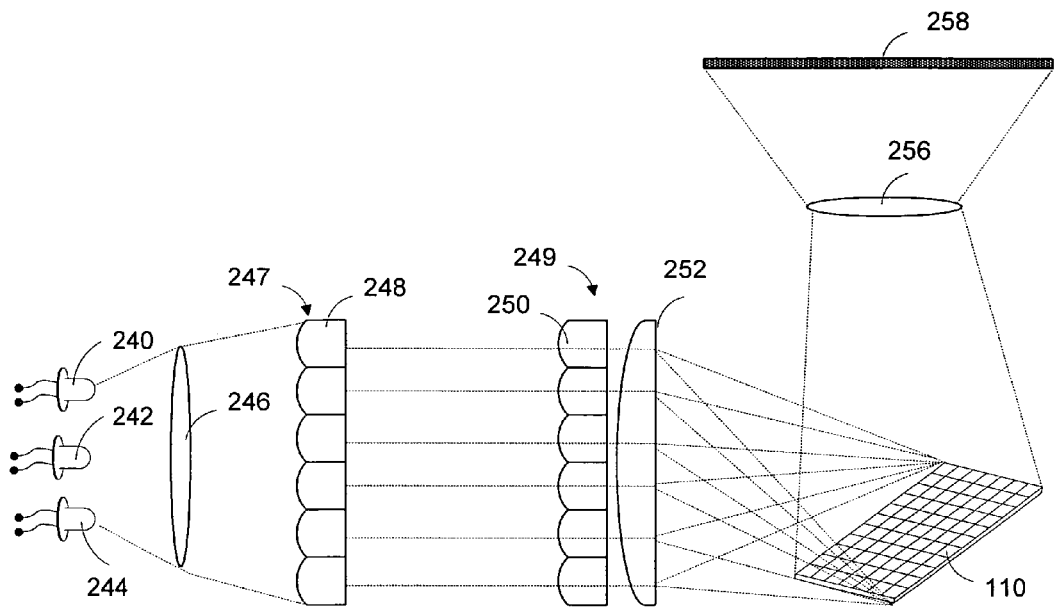

Referring to FIG. 10, an exemplary display system using LEDs as a display light source is demonstratively illustrated therein. In this example, the projection system comprises a LED array (e.g. LEDs 240, 242, and 244) for providing illumination light beam for the system. For demonstration purposes only, three LEDs are illustrated in the figure. In practice, the LED group may have any suitable number of LEDs, including a single LED. The LEDs can be of the same color (e.g. white color) or different colors (e.g. red, green, and blue). The light beams from the LED array are projected onto front fly-eye lens 247 through collimation lens 246. Fly-eye lens 247 comprises multiple unit lenses such as unit lens 248. The unit lenses on fly-eye lens 247 can be cubical lens or any other suitable lenses, and the total number of the unit lenses in the fly-eye lens 247 can be any desired numbers. At fly-eye lens 248, the light beam from each of the LEDs 240, 242, and 244 is split into a number of sub-light beams with the total number being equal to the total number of unit lenses of fly-eye lens 248. After collimation lens 246 and fly-eye lens 247, each LEDs 240, 244, and 246 is imaged onto each unit lens (e.g. unit lens 250) of rear fly-eye lens 249. Rear fly-eye lens 249 comprises a plurality of unit lenses each of which corresponds to one of the unit lenses of the front fly-eye lens 247, such that each of the LEDs forms an image at each unit lens of the rear fly-eye lens 249. Projection lens 252 projects the light beams from each unit lens of fly-eye lens 249 onto spatial light modulator 110.

With the above optical configuration, the light beams from the LEDs (e.g. LEDs 240, 242, and 244) can be uniformly projected onto the micromirror devices of the spatial light modulator.

In the display system, a single LED can be used, in which instance, the LED preferably provides white color. Alternatively, an array of LEDs capable of emitting the same (e.g. white) or different colors (e.g. red, green, and blue) can be employed. Especially when multiple LEDs are employed for producing different colors, each color can be produced by one or more LEDs. In practical operation, it may be desired that different colors have approximately the same or specific characteristic spectrum widths. It may also be desired that different colors have the same illumination intensity. These requirements can be satisfied by juxtaposing certain number of LEDs with slightly different spectrums, as demonstratively shown in FIG. 11.

Figure 11:
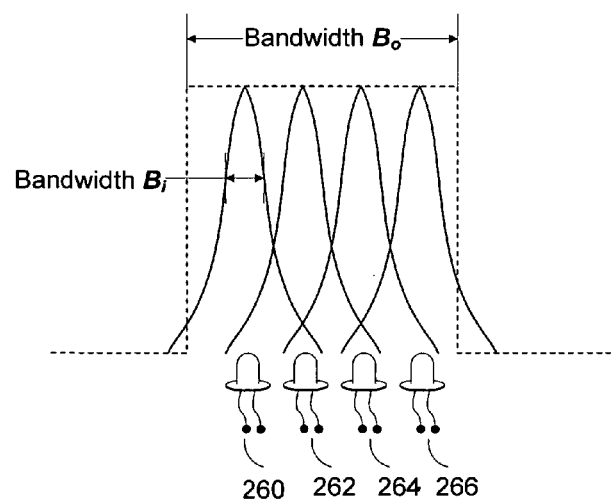
FIG. 11 demonstratively illustrates an exemplary LED array for use in the projection system of FIG. 10.

Referring to FIG. 11, it is assumed that the desired spectrum bandwidth of a specific color (e.g. red) is $B_o$ (e.g. a value from 10 nm to 80 nm, or from 60 nm to 70 nm), and the characteristic spectrum bandwidth of each LED (e.g. LEDs 260, 262, 264, and 266) is $B_i$ (e.g. a value from 10 nm to 35 nm). By properly selecting the number of LEDs with suitable spectrum differences, the desired spectrum can be obtained. As a way of example, assuming that the red color with the wavelength of 660 nm and spectrum bandwidth of 60 nm is desired, LEDs 260, 262, 264, and 266 can be selected and juxtaposed as shown in the figure. LED 260, 262, 264, and 266 may have characteristic spectrum of 660 nm, 665 nm, 670 nm, and 675 nm, and the characteristic spectrum width of each LED is approximately 10 nm. As a result, the effective spectrum width of the juxtaposed LEDs can approximately be the desired red color with the desired spectrum width.

Different LEDs emitting different colors may exhibit different intensities, in which instance, the color balance is desired so as to generate different colors of the same intensity. An approach is to adjust the ratio of the total number of LEDs for the different colors to be balanced according to the ratio of the intensities of the different colors, such that the effective output intensities of different colors are approximately the same.

In the display system wherein LEDs are provided for illuminating a single spatial light modulator with different colors, the different colors can be sequentially directed to the spatial light modulator. For this purpose, the LEDs for different colors can be sequentially turned on, and the LEDs for the same color are turned on concurrently. In another system, multiple spatial light modulators can be used as set forth in U.S. patent application Ser. No. 60/713,005, "Multiple Spatial Light Modulators in a Package" to Huibers, filed Aug. 30, 2005, the subject matter being incorporated herein by reference in entirety. A group of LEDs can be employed in such a display system for producing different colors that sequentially or concurrently illuminate the multiple spatial light modulators.

In addition to the display system as discussed above, the invention can be implemented in other projection systems, as set forth in U.S. patent application Ser. No. 60/678,617 filed May 5, 2005, the subject matter being incorporated herein by reference in its entirety.

As discussed above wherein the micromirror array devices are processed with the illumination treatment before shipping to customers, the micromirror array devices can also be processed with the illuminated treatment in the projection system before or even after shipping to customers. In this instance, the illumination-treatment light source is the display-illumination light source of the projection system. As a way of example with reference to FIG. 8, the micromirror array device can be processed with the illumination treatment by passing the illumination light (from the light source 132) through a clear or, preferably, the blue segment (if any) and illuminating the micromirror array device. This can be done by holding the mirror plates at a deflected state, or at a deflected state, and illuminating the device. An additional heating mechanism can be provided to baking the micromirror array device while being illuminated. When the light source of the system is a LED array comprising a blue color or the like as shown in FIG. 10 and FIG. 11, the micromirror array device can thus be processed with the illumination treatment by holding the mirror plates at the natural resting state (or a deflected state), turning on the blue LED, and illuminating the micromirror array device with the blue LED.

Figure 12A:
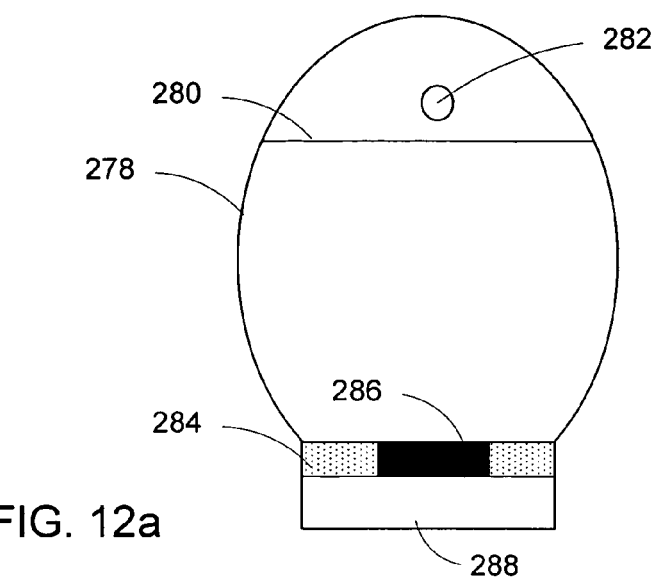
FIG. 12a demonstratively illustrates an exemplary illumination-treatment system for MEMS devices.

Alternative to the illumination-treatment methods which use the display illumination system as discussed above, the micromirror array device, and other MEMS devices with deformable elements, can be illuminated in a system designed to illuminate multiple devices under conditions optimized for the illumination treatment, an example of which is demonstratively illustrated in FIG. 12a. The exemplary system comprises reflective surface 278, light source 282, reflective supporting surface 284 with device 286 disposed thereon, and cooling/heating exchanger 288. Mesh 280 can alternatively be provided, especially when a microwave chamber is used.

Such a system may use a spectrum optimized for the illumination treatment, which is in general different than those used for display systems, and can be designed to deliver efficient coupling of the output optical power from the lamp to the devices being treated and to illuminate as many devices as possible as quickly as possible. The efficient coupling could be achieved by the use of an elliptical reflector 278 where the light source (e.g. bulb 282) being disposed at one focus and the device being disposed at the other focus of the elliptical reflector. All exposed surfaces in the chamber can be as reflective as possible to minimize light loss through absorption. For achieving a high reflectivity to the illumination light used in the illumination treatment, the interior surface of the elliptical reflector may be coated with a suitable reflective layer, such as an aluminum, silver, and/or gold layer with an optional dielectric layer. Specifically, the efficiency (optical power in the desired spectral range delivered to the device(s)/power input to the bulb) can be 0.5% or greater, such as 5% or greater or 20% or greater. Temperature control of the parts can be maintained through the cooling/heating exchanger 288. Light source 282 for producing the illumination-treatment light can be disposed within the space of surrounded by the reflective interior surface. The device to be treated, such as micromirror array device 286 is disposed on reflective supporting surface 284.

Figure 12B:
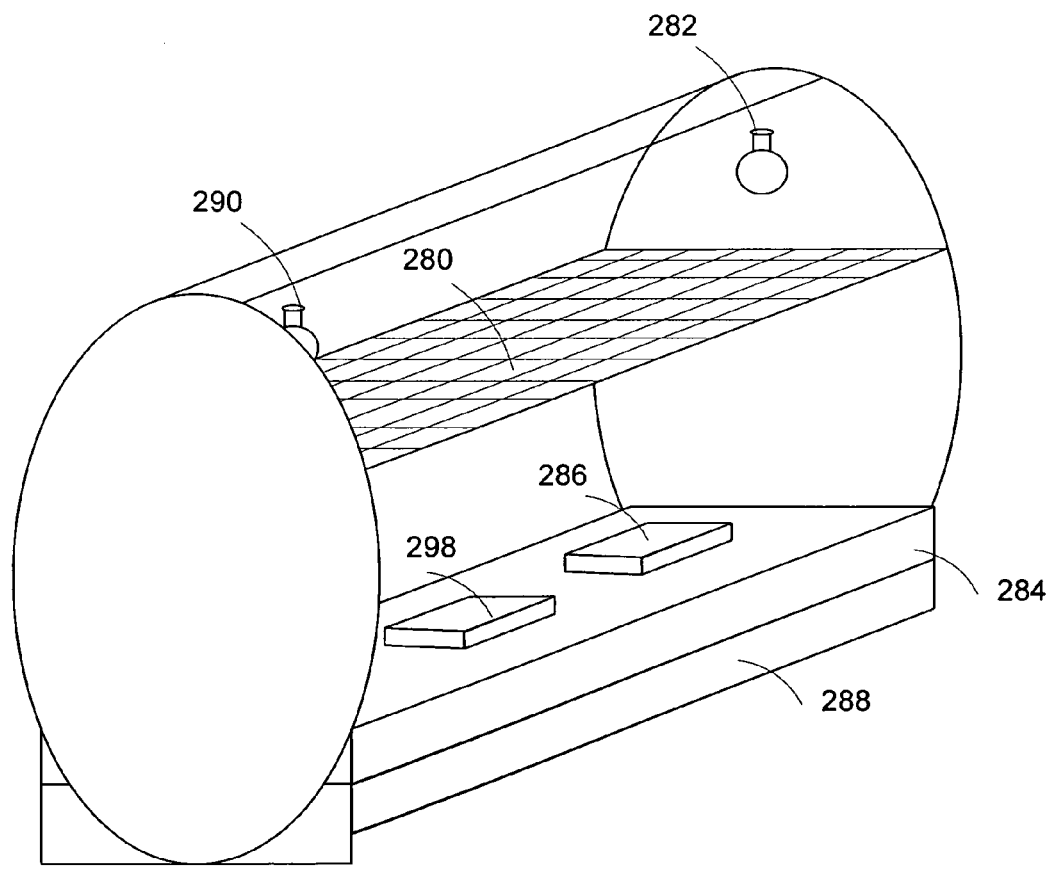
FIG. 12b demonstratively illustrates another exemplary illumination-treatment system for MEMS devices.

FIG. 12b demonstratively illustrates a perspective view of a system as shown in FIG. 12a. In this example, multiple devices, such as devices 286 and 298, can be disposed in the chamber so as to be treated according to the invention. Alternatively, multiple light sources, such as light sources 282 and 290, which may or may not be the same, can be disposed within the chamber for illuminating the devices.

As an alternative feature, the devices, especially the packaged micromirror devices with light transmissive windows, such as those shown in FIG. 6a and FIG. 6b, in the chamber can be covered by a reflective mask for improving the illumination efficiency. An exemplary configuration of the reflective mask is shown in FIG. 12c.

Figure 12C:
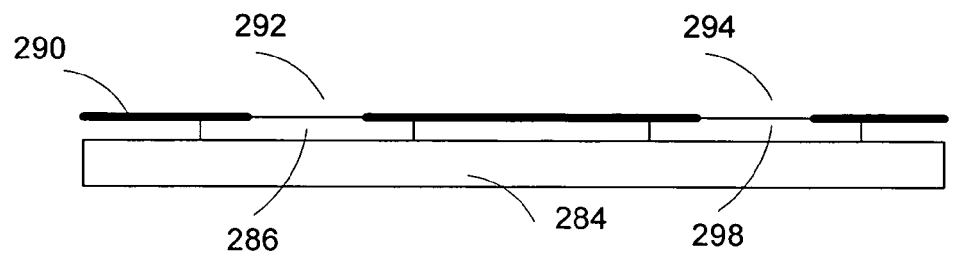
FIG. 12c demonstratively illustrates a reflective mask disposed on the devices to be treated according to one example of the invention.
Figure 12D:
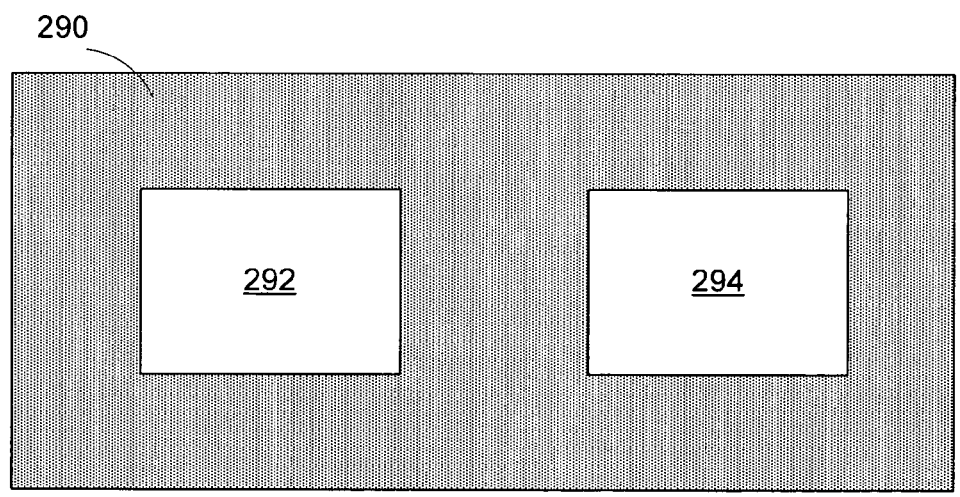
FIG. 12d illustrates a top view of the reflective mask in FIG. 12c.

Referring to FIG. 12c, devices 286 and 298 to be illuminated are disposed on reflective supporting surface 284 (as that shown in FIG. 12a and FIG. 12b). Reflective mask 290 having a reflectivity of 85% or more, or 90% or more to the illumination light is disposed on top of the devices. The reflective mask has openings, such as openings 292 and 294 for allowing the illumination light to illuminate the devices. The openings are at locations aligned to the light transmissive windows (as shown in FIG. 6a and FIG. 6b) of the packaged devices, but may or may not be aligned to the entire package. A top view of a portion of the reflective mask is demonstratively illustrated in FIG. 12d.

It will be appreciated by those of skill in the art that a new and useful processing method for improving the lifetime of microstructures having elements that plastically deform during operation has been described herein. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

I claim:

1. A method comprising:
   packaging a microelectromechanical device (MEMS) having a deformable element;
   reducing a rate of developing residual plastic deformation in the deformable element by illuminating the device with a beam of illumination light, wherein the rate of developing residual plastic deformation is defined as an amount of the residual plastic deformation developed over a time period divided by the time period; and
   delivering the device to a customer.

2. The method of claim 1, wherein the step of reducing the rate of developing residual plastic deformation further comprises:
   illuminating the packaged MEMS device such that a time for the MEMS device to develop a change at an operation state is 1.2 times longer than the time for the MEMS devices to develop the same change at the operation state without being illuminated.

3. The method of claim 2, wherein the operation state is a non-deflected state.

4. The method of claim 1, wherein the illumination treatment is performed before the step of packaging the MEMS device.

5. The method of claim 1, wherein the step of reducing the rate of developing the residual plastic deformation is performed during the step of packaging the MEMS device, further comprising:
   attaching the MEMS device on a package substrate; and
   illuminating the device with the illumination light; and
   bonding a package cover to the package substrate so as to seal the MEMS device between the package substrate and package cover.

6. The method of claim 5, wherein the package substrate is ceramic.

7. The method of claim 5, wherein the package cover is transmissive to visible light.

8. The method of claim 1, wherein the step of reducing the rate of developing the residual plastic deformation is performed after the step of packaging the MEMS device but before delivering the MEMS device to the customer.

9. The method of claim 8, wherein the customer is a projector manufacturer.

10. The method of claim 1, wherein the deformable element is a torsion hinge.

11. The method of claim 1, wherein the deformable element is a flexure hinge.

12. The method of claim 10, wherein the torsion hinge is an element of a micromirror device having a reflective mirror plate attached to the deformable hinge.

13. The method of claim 12, wherein the micromirror device is a member of a micromirror array device that comprises an array of micromirror devices.

14. The method of claim 13, wherein the deformable hinge is formed on a light transmissive substrate.

15. The method of claim 13, wherein the deformable hinge is formed on a semiconductor substrate.

16. The method of claim 13, wherein the mirror plate has a characteristic dimension of 20 microns or less.

17. The method of claim 1, wherein the step of reducing the rate of developing the residual plastic deformation further comprises:
   illuminating the MEMS device such that the MEMS device receives an illumination energy density of 1 kJ/cm$^2$ or higher.

18. The method of claim 17, wherein the MEMS device receives an illumination energy density of 30 kJ/cm$^2$ or higher.

19. The method of claim 17, wherein the MEMS device receives an illumination energy density of 300 kJ/cm$^2$ or higher.

20. The method of claim 1, wherein the illumination light provides an irradiance of 0.01 W/cm$^2$ or higher to the device.

21. The method of claim 1, wherein the illumination light provides an irradiance of 5 W/cm$^2$ or higher to the device.

22. The method of claim 1, wherein the illumination light provides an irradiance of 10 W/cm$^2$ or higher to the device.

23. The method of claim 1, wherein the step of reducing the rate of developing the residual plastic deformation further comprises:
   disposing the MEMS device in an illumination treatment system with an efficiency of 0.5% or greater, wherein the efficiency is defined as a ratio of an optical power in a desired spectral range delivered to the MEMS device and a power input to a light source providing the illumination light.

24. The method of claim 23, wherein the efficiency is 5% or more.

25. The method of claim 1, wherein the illumination light has a spectrum comprising wavelengths from 300 nm to 550 nm.

26. The method of claim 1, wherein the illumination light has a spectrum comprising wavelengths from 370 nm to 470 nm.

27. The method of claim 1, wherein the illumination light has characteristic wavelength around that of the visible blue light.

28. The method of claim 1, wherein the illumination light is provided by a microwave powered lamp.

29. The method of claim 1, wherein the illumination light is provided from an arc lamp.

30. The method of claim 1, wherein the step of reducing the rate of developing the residual plastic deformation further comprises:
   illuminating the device for a time period of 10 minutes or longer.

31. The method of claim 1, wherein the step of reducing the rate of developing the residual plastic deformation further comprises:
   illuminating the device for a time period of 1 hour or longer.

32. The method of claim 1, wherein the step of reducing the rate of developing the residual plastic deformation further comprises:
   maintaining the device at a temperature of 100° C. or higher.

33. The method of claim 1, wherein the step of reducing the rate of developing the residual plastic deformation further comprises:
   maintaining the device at a temperature of 120° C. or higher.

34. The method of claim 12, wherein the step of reducing the rate of developing the residual plastic deformation further comprises:
   maintaining the deformable hinge at a natural resting position.

35. The method of claim 12, defining an ON state and OFF state for the micromirror devices in operation; and wherein the step of reducing the rate of developing the residual plastic deformation further comprises:
   maintaining the deformable hinge at the OFF sate.

36. The method of claim 35, wherein the OFF state is a state wherein the mirror plate has a non-zero angle relative to the substrate.

37. The method of claim 12, defining an ON state and OFF state for the micromirror devices in operation, said ON state is a state wherein the mirror plate of the micromirror device has an ON state angle of +10° degrees or more relative to a substrate on which the mirror plate is formed; and said OFF state being a state wherein the mirror plate has a non-zero angle to the substrate; and wherein the step of reducing the rate of developing the residual plastic deformation further comprises:
maintaining the deformable hinge at a deflected negative angle relative to the substrate.

38. A method comprising:
providing a device having an array of deflectable and reflective mirror plates attached and deformable hinges;
reducing a rate of developing a residual plastic deformation in the deformable hinges by an illumination treatment comprising illuminating the device with a beam of illumination light;
installing the device in a projector; and
delivering the projector to a customer.

39. A method comprising:
providing a device having an array of deflectable and reflective mirror plates attached and deformable hinges;
directing a illumination light beam of a substantially constant wavelength or substantially constant spectrum at a power of 1 $kJ/cm^2$ or higher to the device so as to reduce a rate of developing a residual plastic deformation in the deformable hinges in a customer, wherein the rate of developing residual plastic deformation is defined as an amount of the residual plastic deformation developed over a time period divided by the time period; and
delivering the projector to the customer.

40. The method of claim 39, wherein the power is 30 $kJ/cm^2$ or higher.

41. The method of claim 39, wherein the power is 300 $kJ/cm^2$ or higher.

42. The method of claim 39, wherein the illumination light provides an irradiance of 0.01 $W/cm^2$ or higher to the device.

43. The method of claim 39, wherein the illumination light provides an irradiance of 5 $W/cm^2$ or higher to the device.

44. The method of claim 39, wherein the illumination light provides an irradiance of 10 $W/cm^2$ or higher to the device.

45. The method of claim 39, wherein the step of directing the illumination light beam is performed before a step of packaging the device.

46. The method of claim 39, wherein the step of directing the illumination light beam is performed during a step of packaging the device;
attaching the device on a package substrate; and
illuminating the device with the illumination light beam; and
bonding a package cover to the package substrate so as to seal the device between the package substrate and package cover.

47. The method of claim 46, wherein the package substrate is ceramic; and wherein the package cover is transmissive to visible light.

48. The method of claim 39, wherein the step of directing the illumination light beam further comprises:
disposing the MEMS device in an illumination treatment system with an efficiency of 0.5% or greater, wherein the efficiency is defined as a ratio of an optical power in a desired spectral range delivered to the MEMS device and a power input to a light source providing the illumination light.

49. The method of claim 48, wherein the efficiency is 5% or more.

50. The method of claim 39, wherein the illumination light has a spectrum comprising wavelengths from 300 nm to 550 nm.

51. The method of claim 39, wherein the illumination light has a spectrum comprising wavelengths from 370 nm to 470 nm.

52. The method of claim 39, wherein the illumination light is provided from a microwave-powered lamp.

53. The method of claim 39, wherein the illumination light is provided from an arc lamp.

* * * * *